(12) United States Patent
Alexander et al.

(10) Patent No.: US 7,868,302 B2
(45) Date of Patent: Jan. 11, 2011

(54) NANO-PARTICLE/QUANTUM DOT BASED OPTICAL DIODE

(75) Inventors: Dennis R. Alexander, Lincoln, NE (US); John C. Bruce, III, Lincoln, NE (US); Craig A. Zuhlke, Neligh, NE (US); Brandon E. Koch, Rose Hill, KS (US); Jitender S. Deogun, Lincoln, NE (US); Haitham S. Hamza, Lincoln, NE (US)

(73) Assignee: Board of Regents of the University of Nebraska, Lincoln, NE (US)

( * ) Notice: Subject to any disclaimer, the term of this patent is extended or adjusted under 35 U.S.C. 154(b) by 1321 days.

(21) Appl. No.: 11/337,784

(22) Filed: Jan. 23, 2006

(65) Prior Publication Data

US 2010/0065756 A1 Mar. 18, 2010

Related U.S. Application Data

(60) Provisional application No. 60/704,436, filed on Aug. 2, 2005, provisional application No. 60/678,051, filed on May 5, 2005.

(51) Int. Cl.
*H01J 1/58* (2006.01)
(52) U.S. Cl. .................................................. 250/459.1
(58) Field of Classification Search .............. 250/459.1; 398/48
See application file for complete search history.

(56) References Cited

U.S. PATENT DOCUMENTS

| | | | |
|---|---|---|---|
| 6,357,889 B1 * | 3/2002 | Duggal et al. | 362/84 |
| 6,363,088 B1 * | 3/2002 | Alphonse et al. | 372/6 |
| 6,710,911 B2 * | 3/2004 | LoCascio et al. | 359/326 |
| 2003/0080341 A1 * | 5/2003 | Sakano et al. | 257/79 |
| 2003/0227249 A1 * | 12/2003 | Mueller et al. | 313/491 |
| 2006/0227087 A1 * | 10/2006 | Hajjar et al. | 345/84 |

* cited by examiner

*Primary Examiner*—David P Porta
*Assistant Examiner*—Marcus H Taningco
(74) *Attorney, Agent, or Firm*—Fish & Richardson P.C.

(57) ABSTRACT

A particle based optical diode having at least two cavities or at least two regions of a single cavity, wherein the regions contain different types of particles.

44 Claims, 3 Drawing Sheets

NANO-PARTICLE/QUANTUM DOT BASED OPTICAL DIODE

CROSS REFERENCE TO RELATED APPLICATIONS

This application claims priority under 35 U.S.C. §119(e) from Provisional U.S. Patent Application 60/704,436, filed on Aug. 2, 2005, and Provisional U.S. Patent Application 60/678,051, filed on May 5, 2005 which are hereinafter incorporated by reference.

STATEMENT REGARDING FEDERALLY SPONSORED RESEARCH OR DEVELOPMENT

Not Applicable.

TECHNICAL FIELD

The present invention relates to optical devices, and more particularly relates to a nano-particle/quantum dot based optical diodes.

BACKGROUND OF THE INVENTION

One skilled in the art will realize that numerous signal transmission technologies using a variety of signal types and transmission media exist. Of considerable interest and use over several decades has been optical signal transmission, which permits the use of electromagnetic radiation to carry a signal through an optical media, such as fiber optic cables. The use of optical signals present great advantages over other types of signals, such as electrical signals, including speed of transmission. A disadvantage of optical signals, however, has been the difficulty in directly processing those signals. The processing of an optical signal, such as may be necessary for switching or other purposes, has typically required a conversion of an optical signal to an electronic signal, which may then be processed using well known electrical circuit components such as diodes. The conversion of an optical signal to an electrical signal, followed by the conversion of the processed electrical signal to an optical signal in some circumstances, introduces time delays, additional complexity, and the potential for failure and error in signal transmission and processing.

SUMMARY OF THE INVENTION

The present invention provides systems and methods for the direct processing of optical signals. An optical signal may comprise electromagnetic radiation of one or a plurality of wavelengths. In some embodiments, the present invention may be thought of as an optical diode that behaves in a manner similar to the well known electrical diode, except for optical signals rather than electrical signals. The present invention utilizes nano particles, quantum dots, or other extremely small particles having electromagnetic absorption and radiation characteristics to process optical signals. The terms "particles" shall be used herein to refer to any type of nano particle, quantum dot, or other small particle used to selectively absorb and/or emit electromagnetic radiation.

Passing electromagnetic radiation through a region of particles causes a shift in the wavelength of the electromagnetic radiation, which may be a lengthening or shortening of the wavelength. Of course, shifts to the wavelength of the electromagnetic radiation also shifts the frequency of the radiation. If the electromagnetic radiation is spectroscopic, a shift of wavelength can be expected to have an effect on the intensity vs. wavelength spectrum. Further, if the electromagnetic radiation is caused to proceed through multiple regions of different types of particles, the effect on the Intensity vs. Wavelength Spectra can be expected to become dramatic. In addition, it has been found that different sequential orders in which the different types of particles are encountered by the electromagnetic radiation causes different effects on the Intensity vs. Wavelength Spectrum.

One example of particles that may be used in accordance with the present invention are Core pbSe Infrared Evidots. Infrared Evidots are a semiconductor nanocrystal material system for high performance applications in the infrared spectral region. The Infrared Evidots meet the demand of developers who desire non-linear materials in commercial quantities for phototonics, light emitting diodes, optical switching or applications in emission ranging from 1,000 nanometers to 2,300 nanometers. Core PbSe Infrared Evidots exhibit very strong and fast non-linear effects. The infrared Evidots typically change states in under 2 picoseconds for optical switching applications. Evidots also exhibit gain and intense fluorescence.

Particles for use with the present invention may be fabricated by condensation of pulsed-laser-induced plasmas in inert gases. Si quantum dots in silicon dioxide matrix can be fabricated by thermal annealing of SI-rich SiOx thin films. The size and density of the quantum dots can be precisely controlled.

The tunable absorption spectrum is derived from the trademark size tunable bandgap of quantum dots. The tunable refractive index is due to the discrete energy levels of quantum dots. In traditional semiconductors, the electron energy levels are so close together as to be continuous, making the index of refraction of the bulk material constant, even if electrons jump from valence to the conduction band.

In a quantum dot, there are few enough electron energy levels that they are referred to as discrete—the movement of an electron from one band to another affects the refractive index of the quantum dot. If enough quantum dots permeate an optical device, it is established that the device will have a refractive index that is radiation intensity dependent, an important nonlinear feature making for a superior dielectric filter. The same discrete electron energy levels that allow for the tunable refractive index also allow for tunable optical emission frequencies, making for much more versatile optical cavity devices that tune out unwanted frequencies much more efficiently than traditionally possible.

The present invention system is an optical diode system comprising at least two regions of a wavelength shifting particles. The regions may be cavities containing one or more type of particles. An optical diode system may also comprise a single cavity which is filled with particles of one type in a first region, and with particles of a different type in a second region. The regions can be of the same or different lengths. An optical diode system in accordance with the present invention may also reverse the order in which the electromagnetic radiation passes through the regions of particles of different types.

The present invention also includes methods of controlling the intensity spectrum vs. wavelength of electromagnetic radiation. Methods of the present invention may include providing an optical diode system comprising at least two regions having wavelength shifting particles.

The particles of the region(s) may comprise different types with different wavelength shifting properties.

Electromagnetic radiation may be entered into a system in accordance with the present invention such that it interacts with at least two different types of particles as it passes through and exits the system.

The methods of the present invention may also involve providing a system which permits the reversal of the direction in which electromagnetic radiation passes through the system. One skilled in the art will appreciate that the order in which the electromagnetic radiation encounters the particle types can have significant effects on the end results. For instance, if particles in region "A" shift the wavelength of electromagnetic radiation so that particles in region "B" can better absorb it and further shift the wavelength, but particles region "B" do not shift the wavelength of electromagnetic radiation so that particles in region "A" can better absorb it, then the effect on intensity vs. wavelength spectrum will be different depending on which particle type is first encountered.

Optical diodes in accordance with the present invention may be used in any type of communication network or data processing system. Optical diodes may be used with firmware, such as optical fibers. Optical diodes may also be used for both linear and non-linear communications. Optical diodes may also be used for atmospheric and/or non-atmospheric (such as underwater) networks. Optical diodes may also be used in ad hoc networks.

DETAILED DESCRIPTION OF THE EMBODIMENTS

Figure 1:
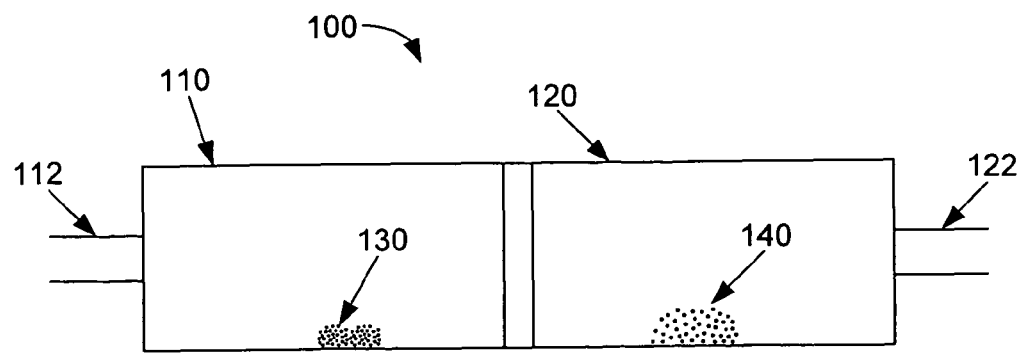
FIG. 1 schematically depicts an example of an optical diode according to an embodiment of the invention.

Turning now to the drawings, FIG. 1 illustrates an example of a diode 100 in accordance with the present invention comprising a first region 110 and a second region 120. The first region 110 and/or the second region 120 may each comprise a cavity containing a particle grouping. A first particle grouping 130 may be located in the first region 110 and a second particle grouping 140 may be located in the second region 120. The first particle grouping 130 may comprise particles of a first size and type, but may also comprise a plurality of types and sizes of particles. The second particle grouping 140 may be a second size and type, but may also comprise a plurality of types and sizes of particles. Electromagnetic radiation may enter the first region 110 through input channel 112. The electromagnetic radiation is then absorbed by the first particle group 130, which then emits electromagnetic radiation at a different wavelength. The wavelength shifted electromagnetic radiation then passes to the second region 120 where, if it is at an appropriate wavelength, radiation at a further shifted wavelength is emitted through output 122. Of course, diode 100 may be used in the reverse direction, such that electromagnetic radiation enters through output 122 and is first incident upon the second particle grouping 140 in the second region 120. Through the selection of the absorption and radiation properties of the first particle grouping 130 and the second particle grouping 140, diode 100 may be constructed such that electromagnetic radiation may pass through diode 100 in one direction but not pass through diode 100 in the other direction.

First region 110 and second region 120 may be adjacent, and may be formed by joining ends of optical fibers each having particles embedded thereon. First region 110 and second region 120 may also be non-adjacent and optically connected by a firmware channel, an atmospheric channel, and/or a non-atmospheric channel (such as an under water channel or a non-atmospheric gas channel). Similarly, input channel 112 and output channel may take the form of firmware, and atmospheric channel, or a non-atmospheric channel (such as an under water channel or a non-atmospheric gas channel). Lasers may be used to carry information over input channel 112 and/or output channel 122.

Figure 2:
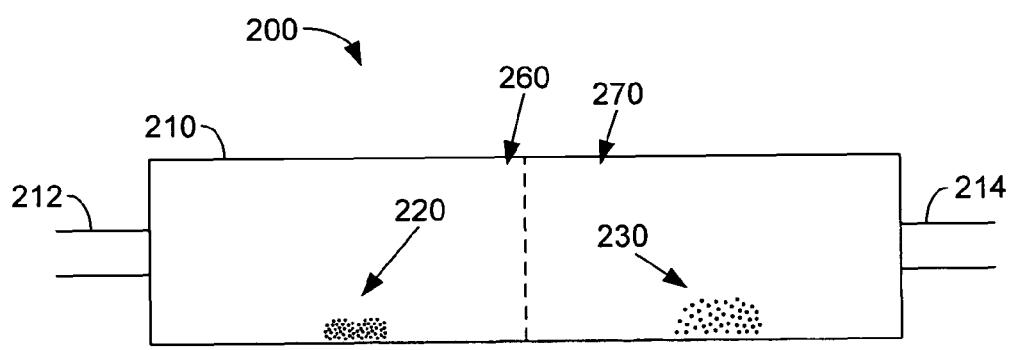
FIG. 2 schematically depicts an example of an optical diode with a single cavity consisting of multiple regions according to an embodiment of the invention.

FIG. 2 shows an example of a diode 200 in accordance with the present invention comprising a single cavity 210 containing a first region 260 having a first particle grouping 220 and a second region 270 having a second particle grouping 230. The use of a single cavity 210 permits a direct interface between the first particles grouping 220 and the second particle grouping 230. First particle grouping 220 may contain particles of at least a first type and size, while the second particle grouping 230 may contain particles of at least a second type and size. While a given particle grouping may include particles of only a single size or type, a given particle grouping may include particles of various types an/or sizes. Electromagnetic radiation may enter cavity 210 through first input/output 212 or through second input/output 214. The electromagnetic radiation may be absorbed by the first particle groping 220 or the second particle grouping 230, depending upon whether the radiation entered diode 200 through first input/output 212 or second input/output 214. After absorption by either the first particle grouping 220 or the second particle grouping 230, the particles will radiate at a shifted wavelength. Depending upon the absorption and radiation properties of the particle groupings, the electromagnetic wavelength at the shifted wavelength may or may not be absorbed by the other particle grouping. If the shifted wavelength radiation is absorbed by the other particle grouping, then the other particle grouping will emit radiation at a further shifted wavelength, which will then exit the diode 200 through the other input/output. As described above, firmware, atmospheric, and/or non-atmospheric channels may be used in conjunction with diode 200.

Figure 3:
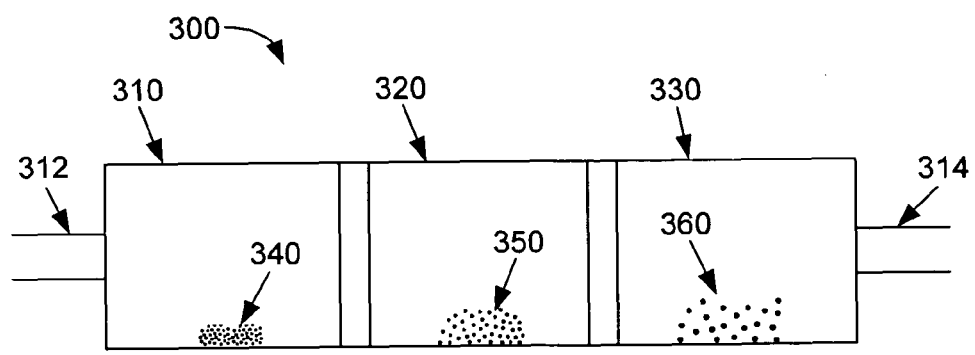
FIG. 3 schematically depicts an example of an optical diode with three regions according to an embodiment of the invention.

Referring now to FIG. 3, a further system 300 in accordance with the present invention is illustrated. Optical signals may enter and exit system 300 through a first input/output 312 and a second input/output 314. A first optical cavity 310 may include a first plurality of particles 340 of a first type. The first plurality of particles 340 may absorb electromagnetic radiation at a given wavelength or range of wavelengths and, in response to the absorption of electromagnetic radiation, emit electromagnetic radiation at a given wavelength. The first plurality of particles 340 may fill all or part of first optical cavity 310. First optical cavity 310 is optically connected to a second optical cavity 320. Second optical cavity 320 contains a second plurality 350 of particles of a second type. The second plurality of particles may absorb electromagnetic radiation at a second absorption wavelength or range of absorption wavelengths and emit electromagnetic radiation at a second emission wavelength or wavelengths. Second optical cavity 320 may be optically connected to a third optical cavity 330. Third optical cavity 330 may contain a third plurality of particles 360 of a third type. The third plurality of particles 360 may absorb electromagnetic radiation at a third absorption wavelength or wavelengths and emit electromagnetic radiation at a third emission wavelength or wavelengths. Third optical cavity 330 may be optically connected to input/output 362, while first optical cavity 310 may be optically connected to first input/output 312. One skilled in the art will now appreciate that, by the selection of the optical properties of the particles in the first plurality 340, the second plurality 350, and the third plurality 360, the direction that electromagnetic radiation is transmitted through system 300 may be controlled. For example, the first plurality of particles 340 may emit at a first emission wavelength that is within the second absorption wavelength of the second plurality of particles 350. Meanwhile, the second plurality of particles 350 may emit electromagnetic radiation at a second emission wavelength that is within the third absorption wavelength of the third plurality of particles 360. In such a configuration, electromagnetic radiation within the first absorption wavelength of the first plurality of particles 340 input through input/output 312 would be transmitted through the length of the system to second input/output 314, at which position the optical signal input at a first wavelength at input 312 will exit at the third emission wavelength through output 314. In the same example, however, the particle types may be selected such that an optical signal input at input/output 314 will not lead to a signal being output from input/output 312. This may be achieved by selecting particles such that the absorption wavelength of the second plurality of particles 350 does not include the third emission wavelength of the third plurality of particles 360. The same affect may also be obtained by selecting the first plurality of particles 340 such that its first absorption wavelength does not include the second emission wavelength of the second plurality of particles 350. As described above, firmware, atmospheric, and/or non-atmospheric channels may be used in conjunction with diode 300.

In further reference to FIG. 3. One skilled in the art will appreciate that system 300 may be configured in a variety of ways differing from that illustrated in FIG. 3. For example, the use of a first cavity 310, a second cavity 320, and a third cavity 330 is not necessary. Each plurality of particles may be dispersed within a single cavity, or without the use of any cavity whatsoever. Moreover, the optical connections need not require that a cavity or a plurality of particles be adjacent to another cavity or plurality of particles, and rather may be over a considerable distance joined by an appropriate connection, such as a fiber optic cable.

Figure 4:
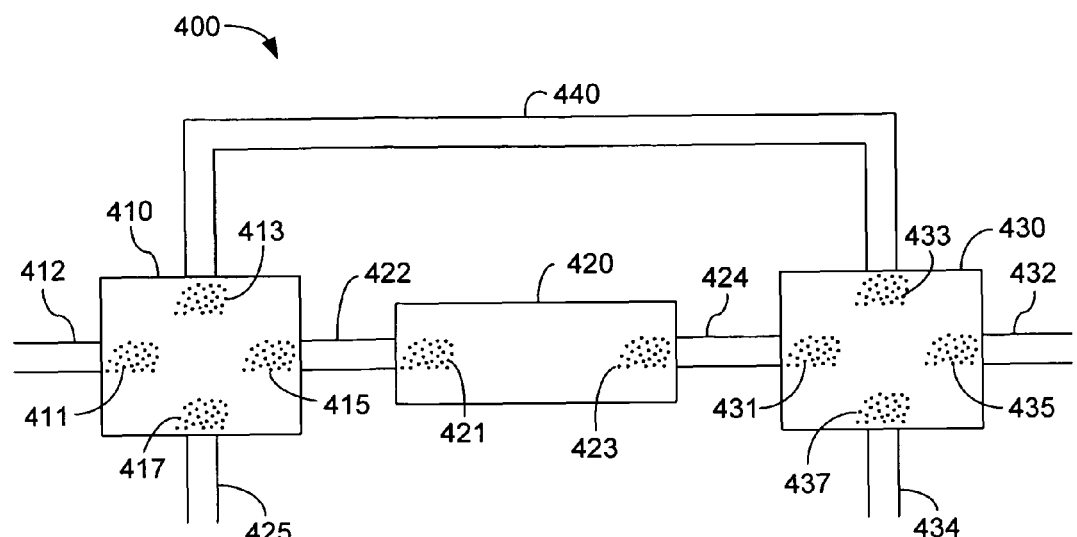
FIG. 4 schematically depicts a cross-over apparatus for directing electromagnetic radiation to proceed through a cavity according to an embodiment of the invention.

Referring now to FIG. 4, a system 400 for the optical processing of electromagnetic signals is illustrated. System 400 includes a first optical cavity 410, a second optical cavity 420, and a third optical cavity 430. Channel 412, channel 425, channel 422, and/or channel 440 may be used to input or output electromagnetic radiation into optical cavity 410. The particle grouping 411 may be associated with channel 412, particle grouping 413 may be associated with channel 440, particle grouping 415 may be associated with channel 422, and particle grouping 417 may be associated with channel 425. Channel 422 may join first optical chamber 410 to second optical chamber 420. Channel 422 and channel 424 may be used to input and/or output electromagnetic radiation into optical chamber 420. Particle grouping 421 may be associated with channel 422, and particle grouping 423 may be associated with channel 424. Channel 424 may connect second optical chamber 420 with third optical chamber 430. Channel 424, channel 434, channel 432, and/or channel 440 may be used to input and/or output electromagnetic radiation into third optical chamber 430. Channel 440 may be used to join first optical chamber 410 and third optical chamber 430. Particle grouping 431 may be associated with channel 424, particle grouping 433 may be associated with channel 440, particle grouping 435 may be associated with channel 432, and particle grouping 437 may be associated with channel 434. By selecting the size of particles in a given particle grouping in the system 400, the path of electromagnetic radiation through system 400 may be determined by the wavelength of electromagnetic radiation input into system 400 and the channel used to provide the input.

Figure 5:
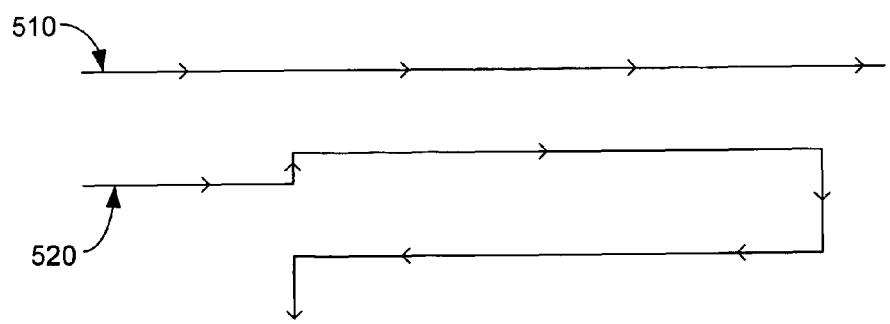
FIG. 5 schematically depicts a cross-over apparatus for directing electromagnetic radiation to proceed through a cavity according to an embodiment of the invention.

FIG. 5 shows two examples of several possible paths that can be taken by electromagnetic radiation through the cavities. Path 520 shows electromagnetic radiation entering cavity 400 through electromagnetic input/output 412 and being emitted by particle grouping 411 and then by particle grouping 413 through electromagnetic input/output 440. Electromagnetic input/output 440 enters the signal to cavity 430 from which it is absorbed and then emitted by particle grouping 433 and then particle grouping 431 through electromagnetic input/output 424. Electromagnetic input/output 424 enters the signal to cavity 420 from which it is absorbed and then emitted by particle grouping 423 and then by particle grouping 421 through electromagnetic input/output 422. Electromagnetic signal then enters cavity 410 through electromagnetic input/output 422 and is absorbed and then emitted by particle grouping 415 and then by particle grouping 417 through electromagnetic input/output 425. Path 510, meanwhile illustrates a signal entering through input/output 412, being emitted and absorbed by particle grouping 411 and then particle grouping 415. Signal then passes through channel 422 and is absorbed and then emitted by particle grouping 421 and then particle grouping 423. Signal then passes through channel 424 and is absorbed and then emitted by particle grouping 431 and then particle grouping 435, finally being output on channel 432.

Figure 6:
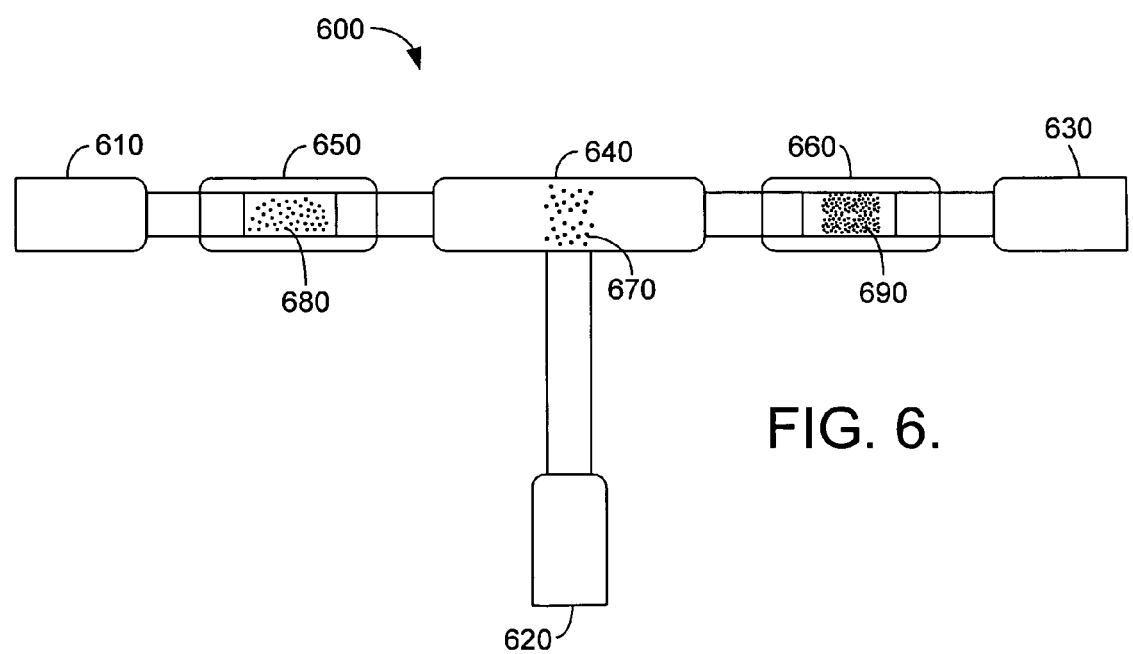
FIG. 6 depicts a further embodiment of the invention.

FIG. 6 shows a further exemplary embodiment of the invention. Electromagnetic radiation can be inputted through either electromagnetic input/output 610, 620, or 630. In this example, cavity 650 contains larger diameter particles 680, while cavity 660 contains smaller diameter particles 690. When electromagnetic radiation is entered in cavity 650 through electromagnetic input/output 610 it is emitted to cavity 640. In cavity 640 the electromagnetic radiation encounters particles 670 and based on the wavelength at which it is emitted, the electromagnetic radiation exits through electromagnetic input/output 620 or enter cavity 660. In cavity 660 it will encounter particles 690 which will emit it through electromagnetic input/output 630. Note that input electromagnetic radiation can pass through either the smaller or larger diameter particles, or both depending on which input/output combination is used

What is claimed is:

1. An optical device comprising:
 a first region of particles of a first type that absorb electromagnetic radiation in a first range of absorption wavelengths and, in response to the absorption of electromagnetic radiation, emit electromagnetic radiation at a first emission wavelength; and
 a second region of particles of a second type that absorb electromagnetic radiation in a second range of absorption wavelengths and, in response to the absorption of electromagnetic radiation, emit electromagnetic radiation at a second emission wavelength, the second region of particles being optically connected to the first region of particles, wherein the second range of absorption wavelengths encompass the first emission wavelength, and the first range of absorption wavelengths do not encompass the second emission wavelength.

2. The optical diode of claim 1, further comprising:
a third region of particles of a third type that absorb electromagnetic radiation in a third range of absorption wavelengths and, in response to the absorption of electromagnetic radiation, emit electromagnetic radiation at a third emission wavelength, the third region of particles being optically connected to the second region of particles.

3. The optical device of claim 2, wherein:
the second range of absorption wavelengths encompass the first emission wavelength; the first range of absorption wavelengths do not encompass the second emission wavelength; and
the third range of absorption wavelengths encompass the second emission wavelength but not the first emission wavelength.

4. The optical device of claim 2, further comprising:
a first optical cavity containing the first region of particles and the second region of particles; and
a second optical cavity containing the third region of particles.

5. The optical device of claim 2, wherein the first region of particles further comprises particles of a fourth type that absorb radiation in a fourth range of absorption wavelengths and, in response to the absorption of electromagnetic radiation, emit electromagnetic radiation at a fourth emission wavelength.

6. The optical device of claim 5, wherein the second region of particles further comprises particles of a fifth type that absorb radiation in a fifth range of absorption wavelengths and, in response to the absorption of electromagnetic radiation, emit electromagnetic radiation at a fifth emission wavelength.

7. The optical device of claim 2, comprising an optical cavity containing the first region of particles, the second region of particles, and the third region of particles.

8. The optical device of claim 1, further comprising:
an optical cavity containing the first region of particles and the second region of particles.

9. The optical device of claim 1, further comprising:
a first optical cavity containing the first region of particles;
a second optical cavity containing the second region of particles; and
a third optical cavity containing the third region of particles.

10. The optical device of claim 1 in which the particles of the first type include at least one of nanoparticles or quantum dots.

11. An optical device comprising:
a first region of particles of a first type that absorb electromagnetic radiation in a first range of absorption wavelengths and, in response to the absorption of electromagnetic radiation, emit electromagnetic radiation at a first emission wavelength;
a second region of particles of a second type that absorb electromagnetic radiation in a second range of absorption wavelengths and, in response to the absorption of electromagnetic radiation, emit electromagnetic radiation at a second emission wavelength, the second region of particles being optically connected to the first region of particles;
a first optical cavity containing the first region of particles; and
a second optical cavity containing the second region of particles.

12. An optical diode comprising:
a first plurality of particles that absorb electromagnetic radiation of at least a first absorption wavelength and emit electromagnetic radiation of at least a first emission wavelength; and
a second plurality of particles that absorb electromagnetic radiation of at least a second absorption wavelength and emit electromagnetic radiation of at least a second emission wavelength, the second plurality of particles being optically connected to the first plurality of particles; and
wherein:
electromagnetic radiation of the first emission wavelength emitted by the first plurality of particles is equal to the second absorption wavelength absorbed by the second plurality of particles; and
electromagnetic radiation of the second emission wavelength emitted by the second plurality of particles is not equal to the first absorption wavelength absorbed by the first plurality of particles.

13. The optical diode of claim 12, further comprising:
a first input/output optically connected to the first plurality of particles and optically connected to the second plurality of particles only through the first plurality of particles; and
a second input/output optically connected to the second plurality of particles and optically connected to the first plurality of particles only through the second plurality of particles.

14. The optical diode of claim 13, further comprising:
an optical cavity containing the first plurality of particles and the second plurality of particles.

15. The optical diode of claim 13, further comprising:
a first optical cavity containing the first plurality of particles; and
a second optical cavity containing the second plurality of particles.

16. The optical diode of claim 12 in which the first plurality of particles include at least one of nanoparticles or quantum dots.

17. A method for transmitting optical signals, the method comprising:
inputting electromagnetic radiation having a first wavelength into a first region of particles of a first type that absorb radiation of the first wavelength and, in response to the absorption of electromagnetic radiation, emits electromagnetic radiation having a second wavelength;
transmitting electromagnetic radiation having the second wavelength from the first region of particles to a second region of particles of a second type that absorb radiation of the second wavelength and, in response to the absorption of electromagnetic radiation, emits electromagnetic radiation having a third wavelength; and
outputting electromagnetic radiation having the third wavelength from the second region of particles.

18. The method for transmitting optical signals of claim 17, wherein the particles of the first type do not absorb radiation having the third wavelength.

19. The method for transmitting optical signals of claim 17, further comprising:

transmitting electromagnetic radiation having the second wavelength from the first region of particles to a third region of particles of a third type that absorb electromagnetic radiation of the third wavelength and, in response to the absorption of the third wavelength, emits electromagnetic radiation having a fourth wavelength.

20. The method for transmitting optical signals of claim 19, further comprising:
inputting electromagnetic radiation having the second wavelength into the second region of particles of the second types;
transmitting electromagnetic radiation having the third wavelength from the second region of particles to the third region of particles; and
outputting electromagnetic radiation having the fourth wavelength from the third region of particles.

21. The method for transmitting optical signals of claim 20, further comprising:
transmitting electromagnetic radiation having the third wavelength from the second region of particles to the first region of particles.

22. The method of claim 17 in which the particles of the first type include at least one of nanoparticles or quantum dots.

23. An apparatus comprising:
a first input/output to input first electromagnetic radiation having a first wavelength;
at least a first particle optically coupled to the first input/output to absorb the first electromagnetic radiation received from the first input/output and emit second electromagnetic radiation having a second wavelength;
at least a second particle optically coupled to the first particle, the second particle to absorb the second electromagnetic radiation and emit third electromagnetic radiation having a third wavelength; and
a second input/output to output the third electromagnetic radiation or an electromagnetic radiation derived from the third electromagnetic radiation.

24. The apparatus of claim 23 in which an emission spectrum of the first particle matches an absorption spectrum of the second particle more closely than a matching between an emission spectrum of the second particle and an absorption spectrum of the first particle.

25. The apparatus of claim 23 in which the first particle comprises at least one of a nanoparticle or a quantum dot.

26. The apparatus of claim 25 in which the second particle comprises at least one of a nanoparticle or a quantum dot.

27. The apparatus of claim 23, comprising a first optical fiber coupled to the first input/output.

28. The apparatus of claim 27, comprising a second optical fiber coupled to the second input/output.

29. The apparatus of claim 23 in which the first particle is positioned closer to the first input/output than the second particle, and the second particle is positioned closer to the second input/output than the first particle.

30. The apparatus of claim 23, comprising at least a third particle to absorb the third electromagnetic radiation and emit fourth electromagnetic radiation having a fourth wavelength, and the second input/output outputs the fourth electromagnetic radiation.

31. The apparatus of claim 30, in which the first particle is positioned closer to the first input/output than the second and third particles, and the third particle is positioned closer to the second input/output than the first and second particles.

32. The apparatus of claim 30 in which an emission spectrum of the second particle matches an absorption spectrum of the third particle more closely than a matching between an emission spectrum of the third particle and an absorption spectrum of the second particle.

33. The apparatus of claim 23 in which the first input/output, the at least one first particle, the at least one second particle, and the second input/output form an optical diode that allows a higher percentage of electromagnetic radiation to travel from the first input/output to the second input/output than from the second input/output to the first input/output.

34. An apparatus comprising:
a first optical cavity having a first particle grouping, at least a second particle, and at least a third particle, the second and third particles having different absorption and emission properties;
a first input/output associated with the first particle grouping;
a second input/output associated with the second particle; and
a third input/output associated with the third particle,
the first particle grouping, the second particle, and the third particle selected such that electromagnetic radiation from the first input/output is selectively routed to the second or third input/output depending on a wavelength of the electromagnetic radiation.

35. The apparatus of claim 34, comprising a second optical cavity having a fourth input/output and a fifth input/output, in which a first optical path optically couples the second input/output to the fourth input/output, and a second optical path optically couples the third input/output to the fifth input/output, and electromagnetic radiation selectively travels the first or second optical path depending on the wavelength of the electromagnetic radiation.

36. The apparatus of claim 34 in which the first particle grouping comprises at least one of a nanoparticle or a quantum dot.

37. An apparatus comprising:
a first optical channel;
a second optical channel;
a first path and a second path through which electromagnetic radiation may travel; and
an optical cavity coupled to the first and second optical channels and the first and second paths, the optical cavity having at least a first particle associated with the first channel and at least a second particle associated with the second channel, the first and second particles having different absorption and emission properties,
the first and second particles being selected such that electromagnetic radiation traveling from the first optical channel to the optical cavity is absorbed and emitted by the first particle and routed to the first path, and electromagnetic radiation traveling from the second optical channel to the optical cavity is absorbed and emitted by the second particle and routed to the second path.

38. The apparatus of claim 37 in which the first particle comprises at least one of a nanoparticle or a quantum dot.

39. An optical diode comprising:
a first particle and a second particle positioned sequentially along a path and selected to allow a larger percentage of electromagnetic radiation to travel in a first direction from the first particle to the second particle than in a second direction from the second particle to the first particle,
the first particle absorbing electromagnetic radiation having a first wavelength and emitting electromagnetic radiation having a second wavelength, the second particle absorbing the electromagnetic radiation having the second wavelength and emitting electromagnetic radiation having a third wavelength.

40. The optical diode of claim 39 in which the first particle comprises at least one of a nanoparticle or a quantum dot.

41. The optical diode of claim 39 in which the second particle absorbs a higher percentage of electromagnetic radiation having the second wavelength than electromagnetic radiation having the first wavelength.

42. An optical device comprising:
a first region of particles of a first type that absorb electromagnetic radiation in a first range of absorption wavelengths and, in response to the absorption of electromagnetic radiation, emit electromagnetic radiation at a first emission wavelength; and
a second region of particles of a second type that absorb electromagnetic radiation in a second range of absorption wavelengths and, in response to the absorption of electromagnetic radiation, emit electromagnetic radiation at a second emission wavelength, the second region of particles being optically connected to the first region of particles, and the particles in the second region absorb more electromagnetic radiation at the first emission wavelength than at a wavelength in the first range of absorption wavelengths.

43. A method of processing electromagnetic radiation, the method comprising:
providing a first particle and a second particle along a path; and
producing different intensity versus wavelength spectrum properties for electromagnetic radiation traveling in different directions along the path by using the first particle to shift a wavelength of electromagnetic radiation traveling in a first direction so that the second particle can better absorb the radiation from the first particle and further shift the wavelength of the radiation, the second particle not shifting a wavelength of electromagnetic radiation traveling in a second direction to allow the first particle to better absorb the radiation.

44. A method of processing electromagnetic radiation, the method comprising:
providing a first particle and a second particle along a path;
allowing electromagnetic radiation to travel in a first direction along the path by sequentially using the first particle to shift the wavelength of the electromagnetic radiation from a first wavelength to a second wavelength and using the second particle to shift the electromagnetic radiation from the second wavelength to a third wavelength; and
preventing electromagnetic radiation from travelling in a second direction along the path by using the second particle to shift the wavelength of the electromagnetic radiation from the first wavelength to the third wavelength that is not absorbed by the first particle.

* * * * *